(12) United States Patent
Hwang et al.

(10) Patent No.: US 11,301,106 B2
(45) Date of Patent: Apr. 12, 2022

(54) DISPLAY DEVICE INCLUDING BUILT-IN COMPONENTS TO SENSE INPUT THROUGH ELECTROMAGNETIC PEN

(71) Applicant: Samsung Display Co., Ltd., Yongin-Si (KR)

(72) Inventors: Hyun-Been Hwang, Suwon-si (KR); Yongchan Jeon, Cheonan-si (KR); Cheol ho Choi, Asan-si (KR); Hirotsugu Kishimoto, Hwaseong-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/013,856

(22) Filed: Sep. 8, 2020

(65) Prior Publication Data

US 2021/0223892 A1 Jul. 22, 2021

(30) Foreign Application Priority Data

Jan. 22, 2020 (KR) .......................... 10-2020-0008279

(51) Int. Cl.
*G06F 3/046* (2006.01)
*H01L 27/32* (2006.01)
*G06F 3/0354* (2013.01)

(52) U.S. Cl.
CPC .......... *G06F 3/046* (2013.01); *G06F 3/03545* (2013.01); *H01L 27/322* (2013.01); *H01L 27/323* (2013.01); *G06F 2203/04102* (2013.01)

(58) Field of Classification Search
CPC ................. G06F 3/046; G06F 3/03545; G06F 2203/04102; H01L 27/32; H01L 27/323; H01L 28/10
See application file for complete search history.

(56) References Cited

U.S. PATENT DOCUMENTS

| | | |
|---|---|---|
| 4,878,553 A | 11/1989 | Yamanami et al. |
| 2015/0185048 A1* | 7/2015 | Liu .......................... G01D 5/20 345/174 |
| 2016/0139701 A1* | 5/2016 | Wang .................... G06F 3/0446 345/174 |
| 2018/0137801 A1* | 5/2018 | An .......................... G06F 1/163 |
| 2018/0246608 A1 | 8/2018 | Huh et al. |
| 2019/0018516 A1 | 1/2019 | Kim et al. |
| 2019/0146619 A1* | 5/2019 | Kurasawa ............. G06F 3/0416 345/173 |

FOREIGN PATENT DOCUMENTS

| | | |
|---|---|---|
| KR | 10-0510729 B1 | 8/2005 |
| KR | 10-2018-0099230 A | 9/2018 |
| KR | 10-2019-0008491 A | 1/2019 |

* cited by examiner

*Primary Examiner* — Lisa S Landis
(74) *Attorney, Agent, or Firm* — Innovation Counsel LLP

(57) ABSTRACT

Provided is a display device. The display device comprises a functional layer in which a plurality of pixel areas are defined and which includes at least one coil to which an AC signal is applied and an input sensor configured to sense an input from an external source and disposed on the functional layer. The input sensor comprises a first conductive layer including a first sensing loop extending in a first direction, a sensing insulation layer disposed on the first conductive layer, and a second conductive layer disposed on the sensing insulation layer and including a second sensing loop extending in a second direction crossing the first direction.

17 Claims, 13 Drawing Sheets

DISPLAY DEVICE INCLUDING BUILT-IN COMPONENTS TO SENSE INPUT THROUGH ELECTROMAGNETIC PEN

CROSS-REFERENCE TO RELATED APPLICATIONS

This U.S. non-provisional patent application claims priority under 35 U.S.C. § 119 of Korean Patent Application No. 10-2020-0008279, filed on Jan. 22, 2020, the entire contents of which are hereby incorporated by reference.

BACKGROUND

Generally, the present disclosure relates to a display device. More particularly, the present disclosure relates to a display device having built-in components that sense an input through an electromagnetic pen.

Display device may sense an external input applied from the outside. The external input may be a user's input. The user's input includes various types of external inputs such as a portion of user's body, light, heat, an electromagnetic pen, a pressure, or the like. Particularly, such a display device may include a digitizer that senses a touch by an electromagnetic pen. The digitizer may be applied to the display device in various manners such as an electromagnetic resonance (EMR) manner or an active electrostatic (AES) manner.

SUMMARY

The present disclosure provides a display device that is capable of sensing a touch through an electromagnetic pen.

An embodiment of the present disclosure provides a display device comprising: a functional layer in which a plurality of pixel areas are defined and which includes a coil to which an AC signal is applied; and an input sensor configured to sense an input from an external source and disposed on the functional layer, wherein the input sensor includes: a first conductive layer including a first sensing loop extending in a first direction; a sensing insulation layer disposed on the first conductive layer; and a second conductive layer disposed on the sensing insulation layer and including a second sensing loop extending in a second direction crossing the first direction.

In an embodiment, the functional layer may further comprises: a base layer; a circuit layer disposed on the base layer and including a transistor; and a display element layer disposed on the circuit layer and comprising a light emitting element, wherein the functional layer may provide an image toward the input sensor.

In an embodiment, the circuit layer may include a plurality of conductive layers, and at least a portion of the coil may be disposed on a same layer as at least one conductive layer of a plurality of conductive layers.

In an embodiment, the light emitting element may comprise: a first electrode electrically connected to the transistor; a light emitting layer disposed on the first electrode; and a second electrode disposed on the light emitting layer, wherein the coil may be disposed on a same layer as the first electrode and spaced apart from the first electrode.

In an embodiment, the input sensor may further comprise a cover insulation layer disposed on the second conductive layer.

In an embodiment, the input sensor may further comprise a color filter layer disposed on the second conductive layer to contact the sensing insulation layer.

In an embodiment, the coil is provided in plurality, and the plurality of coils may include first coils and second coils spaced apart from the first coils in the first direction, wherein the first coils may extend in a first cross direction crossing the first direction and the second direction, and the second coils may extend in a second cross direction crossing the first direction, the second direction, and the first cross direction.

In an embodiment, the coil may include a first pattern portion having a spiral shape and a second pattern portion connected to an end of the first pattern portion.

In an embodiment, the first pattern portion and the second pattern portion may be disposed on layers different from each other.

In an embodiment, the coil may be provided in plurality, and a plurality of coils may be arranged to be spaced apart from each other in the first direction and the second direction.

In an embodiment, one of the first conductive layer and the second conductive layer may further include first sensing patterns, second sensing patterns, and a first connection pattern configured to connect the first sensing patterns to each other, and an other one of the first conductive layer and the second conductive layer may further include a second connection pattern configured to connect the second sensing patterns to each other.

In an embodiment, when viewed in a plane, the first sensing loop and the second sensing loop may surround some of the first sensing patterns and some of the second sensing patterns respectively.

In an embodiment, in a plane, each of the first sensing loop and the second sensing loop may have a shape corresponding to a boundary between each of the first sensing patterns and each of the second sensing patterns.

In an embodiment, the functional layer may further include a plurality of color filters, each of the plurality of color filters may be disposed in a one-to-one correspondence to each of the plurality of pixel areas, and the coil may function as a light blocking pattern.

In an embodiment, the display device may further comprise a display panel including a display element layer disposed on the input sensor and including a light emitting element, wherein the display panel may be configured to provide an image toward the functional layer.

In an embodiment, the functional layer and the input sensor may be folded.

In an embodiment of the present disclosure, a display device comprises: a display panel including a base layer, a circuit layer disposed on the base layer, and a light emitting element disposed on the circuit layer; an input sensor disposed on the display panel and including a first sensing electrode, a second sensing electrode, a first sensing loop, and a second sensing loop; and at least one coil to which an AC signal is applied, wherein the coil is disposed between the base layer and the input sensor configured to be provided in the display panel or disposed on the input sensor.

In an embodiment, the coil may be disposed on a same layer as a conductive layer constituting the circuit layer or disposed on a same layer as a conductive layer constituting the light emitting element.

In an embodiment, the display device may further comprise a color filter layer disposed on the input sensor, the coil may be disposed between the input sensor and the color filter layer and is covered by the color filter layer.

In an embodiment, a plurality of pixel areas and a non-pixel area adjacent to the plurality of pixel areas may be defined in the display panel, and the coil, the first sensing loop, and the second sensing loop overlap the non-pixel area.

BRIEF DESCRIPTION OF THE FIGURES

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
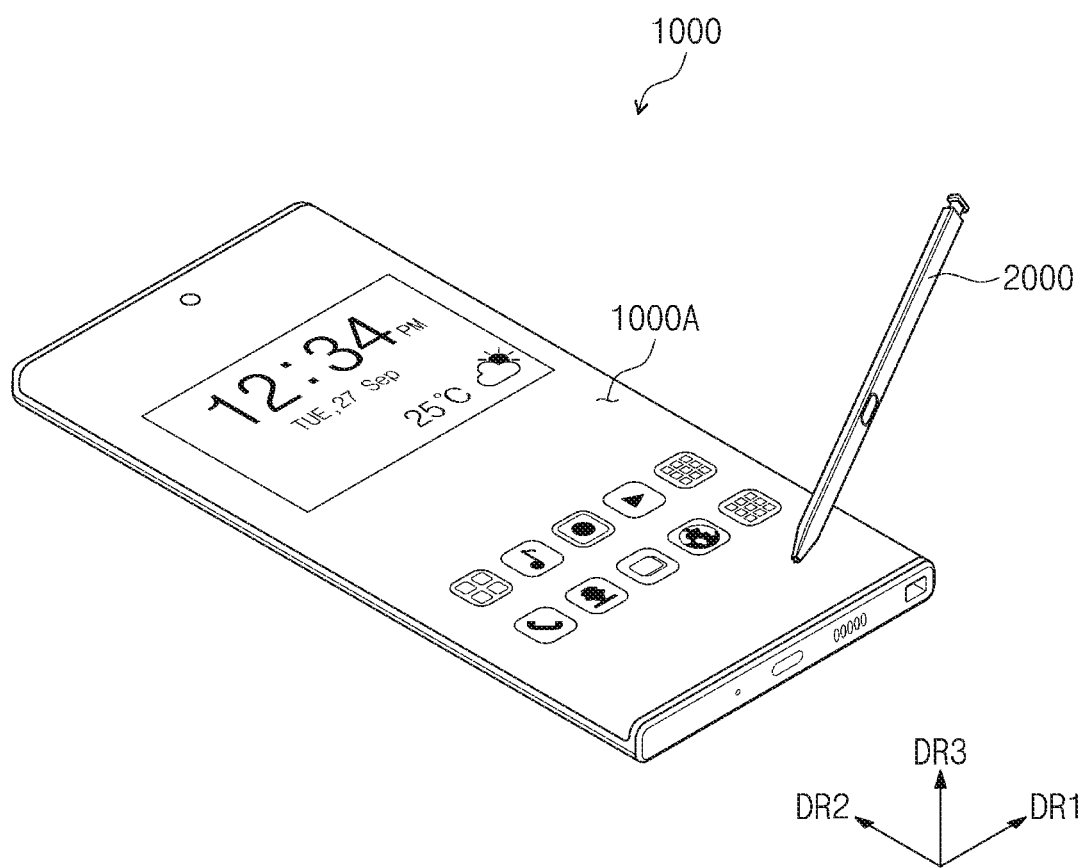
FIG. 1 is a perspective view of a display device according to an embodiment of the present disclosure.

In this specification, it will also be understood that when one component (or region, layer, portion) is referred to as being "on", "connected to", or "coupled to" another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this disclosure belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, example embodiments of the present disclosure will be described with reference to the accompanying drawings.

FIG. 1 is a perspective view of a display device according to an embodiment of the present disclosure.

Referring to FIG. 1, a display device 1000 may be a device activated according to an electrical signal. For example, the display device 1000 may be a mobile phone, a tablet PC, a car navigation system, a game console, or a wearable device, but is not limited. FIG. 1 illustrates an example in which the display device is a mobile phone.

The display device 1000 may display an image through an active area 1000A. The active area 1000A may include a surface defined by a first direction DR1 and a second direction DR2. A thickness direction of the display device 1000 may be parallel to a third direction DR3 crossing the first direction DR1 and the second direction DR2. Thus, a front surface (or top surface) and a rear surface (or bottom surface) of each of members constituting the display device 1000 may be defined based on the third direction DR3.

The display device 1000 may sense inputs applied from an external source. The external input may be a user's input. The user's input may include various types of external inputs such as a portion of the user's body, an electromagnetic pen 2000, light, heat, or a pressure. In FIG. 1, the electromagnetic pen 2000 is illustrated as an example. The display device 1000 may sense an external input by an electromagnetic magnetic resonance (EMR) generated between magnetic fields generated inside the display device 1000 and the electromagnetic pen 2000.

Figure 2:
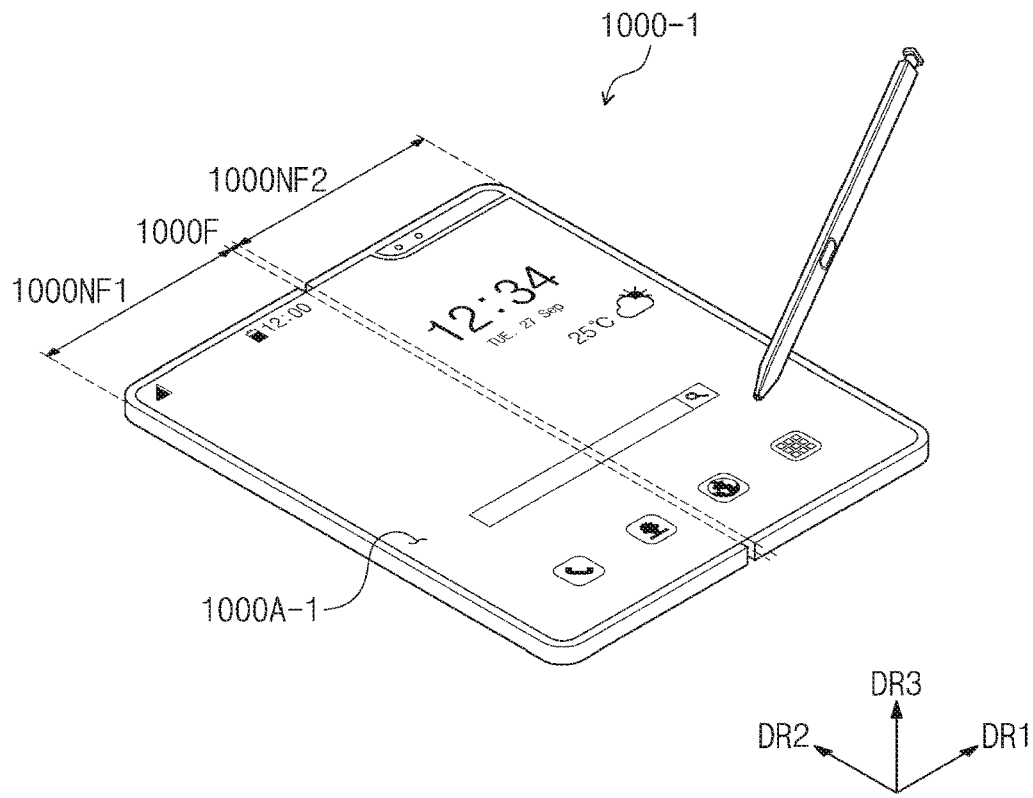
FIG. 2 is a perspective view of a display device according to an embodiment of the present disclosure.

FIG. 2 is a perspective view of a display device according to an embodiment of the present disclosure.

Referring to FIG. 2, a display device 1000-1 may be a foldable display device. A first non-folding area 1000NF1, a folding area 1000F, and a second non-folding area 1000NF2 may be sequentially defined on the display device 1000-1 in the first direction DR1. That is, the folding area 1000F may be defined between the first non-folding area 1000NF1 and the second non-folding area 1000NF2.

In FIG. 2, although one folding area 1000F and the first and second non-folding areas 1000NF1 and 1000NF2 are illustrated, the embodiment of the present disclosure is not limited. That is, the number of folding area 1000F and first and second non-folding areas 1000NF1 and 1000NF2 are not limited. For example, the display device 1000 may include more than two non-folding areas and folding areas between the non-folding areas.

The display device 1000-1 may display an image through an active area 1000A-1.

When the display device 1000-1 is folded, a display surface of the first non-folding area 1000NF1 and a display surface of the second non-folding area 1000NF2 may face each other. Thus, when the display device 1000-1 is completely folded, the active area 1000A-1 may not be exposed to the outside. This may be referred to as in-folding. However, this is mere an example, and the embodiment of the present disclosure is not limited.

When the display device 1000-1 is folded, the display surface of the first non-folding area 1000NF1 and the display surface of the second non-folding area 1000NF2 may face each other. Thus, in the folded state, the active area 1000A-1 may be exposed to the outside. This may be referred to as out-folding. Also, the display device 1000-1 may be in-folded and out-folded. For example, one folding area 1000F may be in-folded and out-folded. Alternatively, the display device 1000-1 may include a plurality of folding areas, and thus, some of the folding areas may be in-folded, and others may be out-folded.

Figure 3:
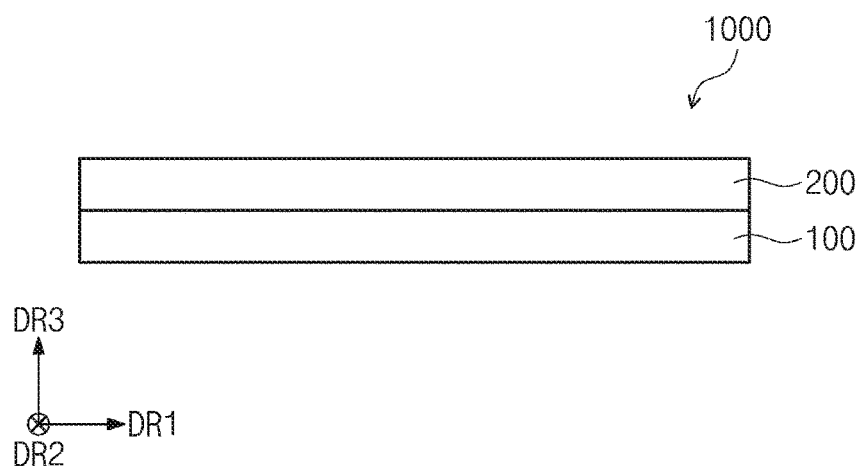
FIG. 3 is a cross-sectional view of a display apparatus according to an embodiment of the present disclosure.

FIG. 3 is a cross-sectional view of a display apparatus according to an embodiment of the present disclosure.

Referring to FIG. 3, the display device 1000 may include a functional layer 100 and an input sensor 200.

The functional layer 100 may be a layer having a function of generating an image. The functional layer 100 may provide an image in a direction toward the input sensor 200. Hereinafter, the functional layer 100 is referred to as a display panel.

The display panel 100 may be a light emitting display panel, but is not particularly. For example, the display panel 100 may be an organic light emitting display panel or a quantum dot light emitting display panel. The organic light emitting display panel may include an organic light emitting material. A light emitting layer of the quantum dot light emitting display panel may include a quantum dot, a quantum rod, and the like.

The input sensor 200 may be disposed on the display panel 100. The input sensor 200 may sense an external input in a mutual cap manner and/or a self-cap manner. However, the external input sensing manner is not limited to the above example.

The display device 1000 may include components capable of sensing an input of the electromagnetic pen 2000 (see FIG. 1). For example, the above-described components may include a coil to which an AC signal is applied, and first and second sensing loops that sense the input by the electromagnetic pen (see FIG. 1).

According to an embodiment of the present disclosure, the coil, the first sensing loop, and the second sensing loop may be built in the display device 1000. For example, some of the coil, the first sensing loop, and the second sensing loop may be provided in the display panel 100, and others may be provided in the input sensor 200.

That is, according to an embodiment of the present disclosure, a separate digitizer for sensing the input by the electromagnetic pen 2000 (see FIG. 1) is not additionally provided. Thus, since the display device 1000 is reduced in thickness, the thin display device 1000 may be provided. In addition, the flexibility of the display device 1000 may be improved due to the reduction in thickness of the display device 1000. As a result, the foldable display device 1000-1 (see FIG. 2) capable of sensing the input by the electromagnetic pen (see FIG. 2) may be provided.

Figure 4:
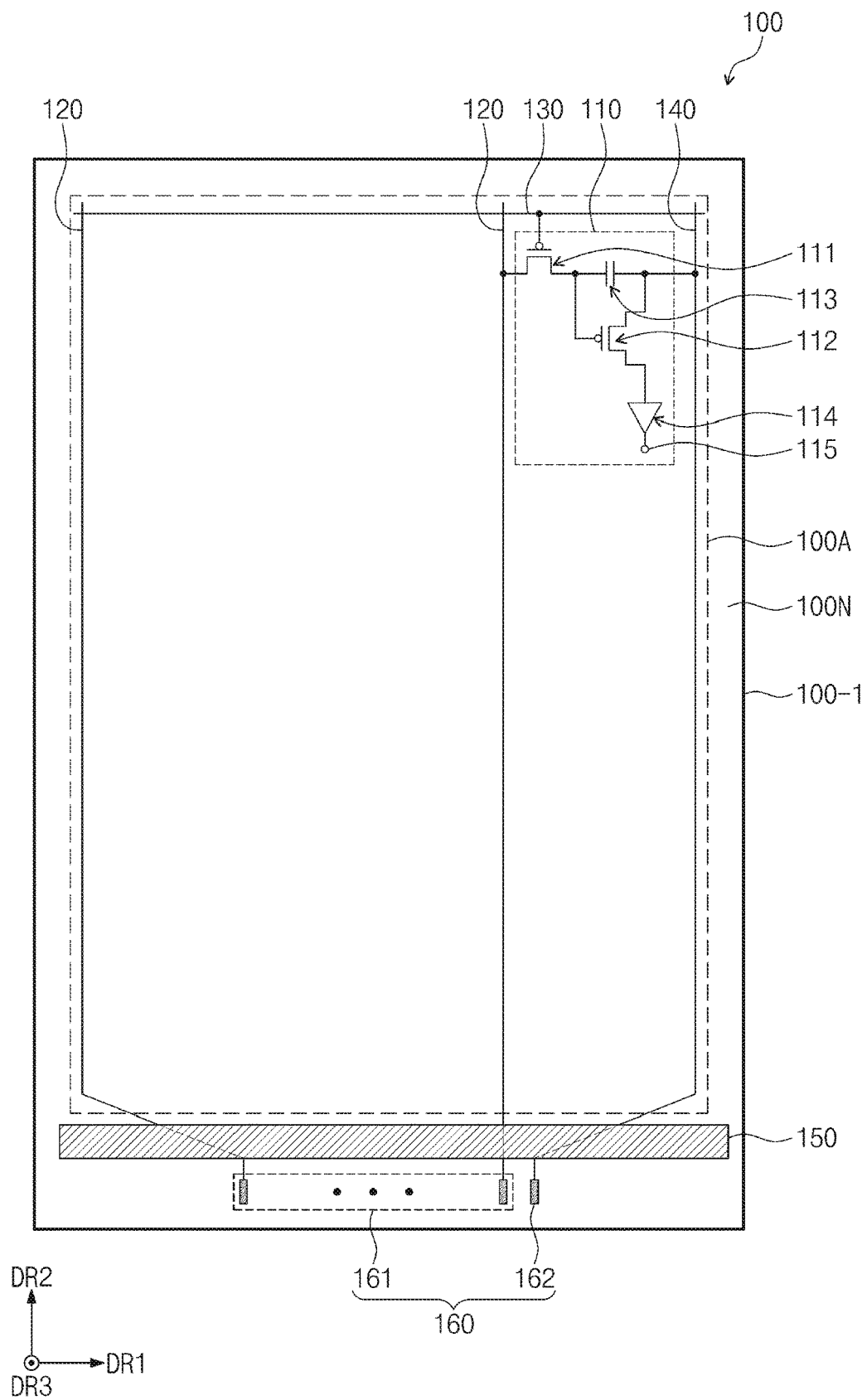
FIG. 4 is a plan view of a display panel according to an embodiment of the present disclosure.

FIG. 4 is a plan view of a display panel according to an embodiment of the present disclosure.

Referring to FIG. 4, a display panel 100 may include an active area 100A and a peripheral area 100N. The active area 100A may be an area that is activated according to an electrical signal. The active area 100A may be an area displaying an image. The peripheral area 100N may include or surround the active area 100A. A driving circuit (not shown) or a driving line (not shown) for driving the active area 100A may be disposed on the peripheral area 100N.

The display panel 100 may include a base layer 100-1, a plurality of pixels 110, a plurality of signal lines 120, 130, and 140, a power pattern 150, and a plurality of display pads 160.

The base layer 100-1 may include a synthetic resin film. The synthetic resin layer may include a thermosetting resin. The base layer 100-1 may have a multi-layered structure. For example, the base layer 100-1 may have a three-layer structure constituted by a synthetic resin layer, an adhesive layer, and a synthetic resin layer. Particularly, the synthetic resin layer may be a polyimide resin layer, and the material thereof is not particularly limited. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin. In addition, the base layer 100-1 may include a glass substrate or an organic/inorganic composite substrate.

The signal lines 120, 130, and 140 are connected to the pixels 110 to transmit electrical signals to the pixels 110. FIG. 4 illustrates that the signal lines 120, 130, and 140 include a data line 120, a scan line 130, and a power line 140. However, this is merely an example, and thus, the signal lines 120, 130, and 140 may further include at least one of an initialization voltage line or an emission control line, but is not limited to a specific embodiment.

The pixels 110 may be disposed in the active area 100A. In this embodiment, an enlarged equivalent circuit diagram of one pixel 110 of the plurality of pixels is illustrated as an example.

The pixel 110 may include a first transistor 111, a second transistor 112, a capacitor 113, and a light emitting element 114. The first transistor 111 may be a switching element that controls turn on/off of the pixel 110. The first transistor 111 may transmit or block a data signal transmitted through the data line 120 in response to a scan signal transmitted through the scan line 130.

The capacitor 113 is connected to the first transistor 111 and the power line 140. The capacitor 113 charges electrical charges by an amount corresponding to a difference between the data signal received from the first transistor 111 and a first power signal applied to the power line 140.

The second transistor 112 is connected to the first transistor 111, the capacitor 113, and the light emitting element 114. The second transistor 112 controls driving current flowing through the light emitting element 114 to correspond to an amount of charges stored in the capacitor 113. A turn-on time of the second transistor 112 may be determined according to the amount of charges charged in the capacitor 113. The second transistor 112 provides the first power signal transmitted through the power line 140 during the turn-on time.

The light emitting element 114 may generate light or control an amount of light according to the electrical signal.

For example, the light emitting element 114 may include an organic light emitting element or a quantum dot light emitting element.

The light emitting element 114 may be connected to a power source terminal 115 to receive a power signal (hereinafter, referred to as a second power signal) which is different from the first power signal provided by the power line 140. The driving current corresponding to a difference between the electrical signal provided from the second transistor 112 and the second power signal may flow through the light emitting element 114, and the light emitting element 114 may generate light corresponding to the driving current. However, this is merely an example. For example, the pixel 110 may include electronic elements having various configurations and arrangements, but is not limited to a specific embodiment.

The power pattern 150 may be disposed on the peripheral area 100N. The power pattern 150 may be electrically connected to the plurality of power lines 140. Thus, the display panel 100 may include the power pattern 150 to provide the first power signal having substantially the same level to the plurality of pixels.

The display pads 160 may include a first pad 161 and a second pad 162. The first pad 161 may be provided in plurality, and the plurality of first pads 161 may be connected to the data lines 120 respectively. The second pad 162 may be connected to the power pattern 150 and also electrically connected to the power line 140. The display panel 100 may provide electrical signals provided from the outside to the pixels 110 through the display pads 160. The display pads 160 may further include pads for receiving other electrical signals in addition to the first pad 161 and the second pad 162, but is not limited to a specific embodiment.

Figure 5:
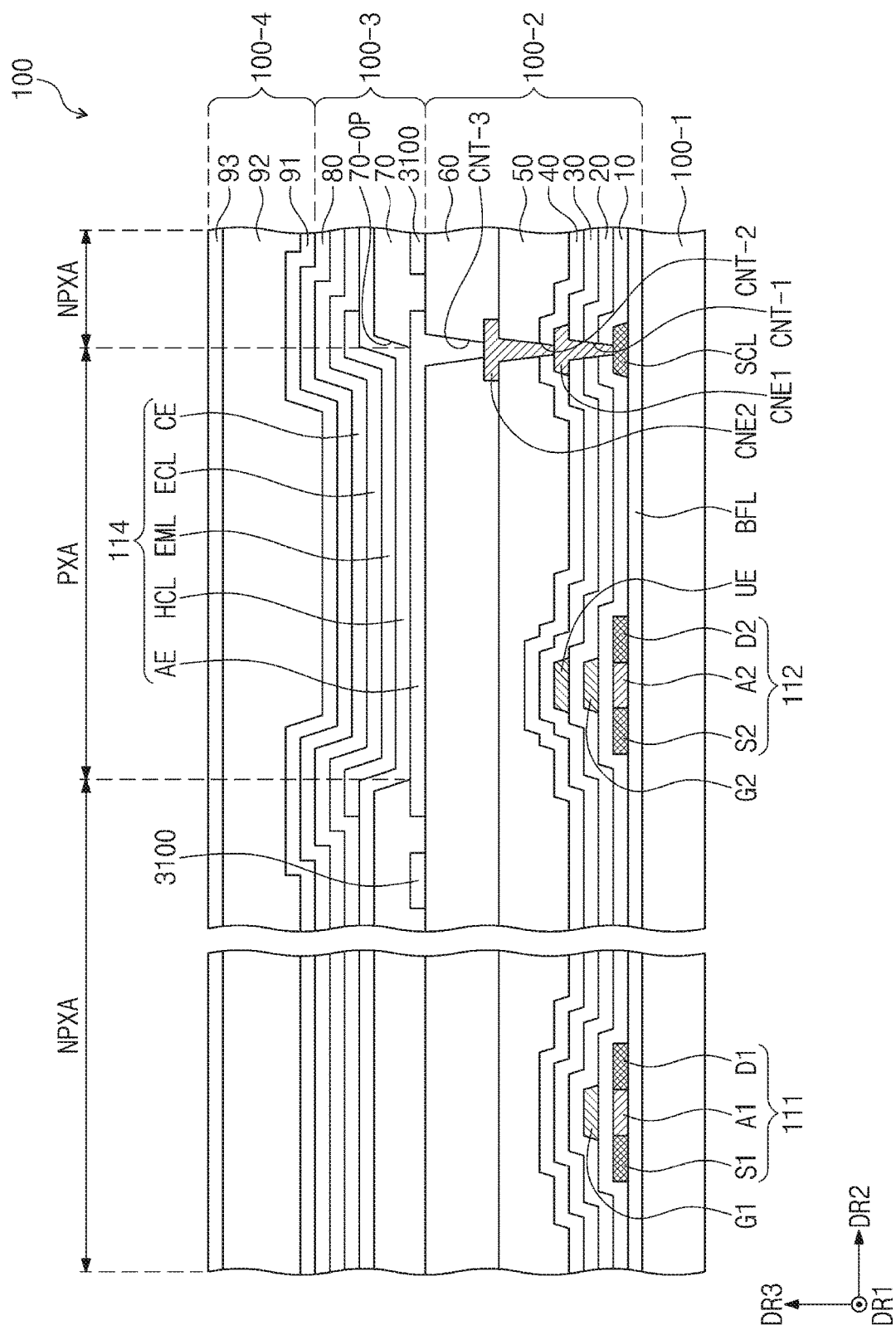
FIG. 5 is a cross-sectional view of a display panel according to an embodiment of the present disclosure.

FIG. 5 is a cross-sectional view of the display panel according to an embodiment of the present disclosure.

Referring to FIG. 5, the display panel 100 may include a plurality of insulation layers, a semiconductor pattern, a conductive pattern, a signal line, and the like. The insulation layer, the semiconductor layer, and the conductive layer may be formed through manners such as coating, deposition, and the like. Thereafter, the insulation layer, the semiconductor layer, and the conductive layer may be selectively patterned in a photolithography manner. The semiconductor pattern, the conductive pattern, and the signal line, which are provided in a circuit layer 100-2 and a display element layer 100-3, may be formed in the above-described manners. Thereafter, an encapsulation layer 100-4 covering the display element layer 100-3 may be provided.

At least one inorganic layer may be disposed on a top surface of the base layer 100-1. The inorganic layer may include at least one of oxide, titanium oxide, silicon oxide, silicon oxide nitride, zirconium oxide, or hafnium oxide. The inorganic layer may be provided as a multilayer. The multi-layered inorganic layer may constitute a barrier layer and/or a buffer layer. In this embodiment, the display panel 100 includes a buffer layer BFL which is disposed on the base layer 100-1.

The buffer layer BFL improves bonding force between the base layer 100-1 and the semiconductor pattern. The buffer layer BFL may include a silicon oxide layer and a silicon nitride layer. The silicon oxide layer and the silicon nitride layer may be alternately laminated.

The semiconductor pattern is disposed on the buffer layer BFL. The semiconductor pattern may include polysilicon. However, the embodiment of the present disclosure is not limited. For example, the semiconductor pattern may include amorphous silicon or metal oxide.

FIG. 5 illustrates merely a portion of the semiconductor pattern. For example, the semiconductor pattern may be further disposed on other areas. The semiconductor pattern may be arranged in a specific rule over the pixels 110 (see FIG. 4). The semiconductor pattern has different electrical properties depending on whether the semiconductor pattern is doped. The semiconductor pattern may include a doped region and a non-doped region. The doped region may be doped with an N-type dopant or a P-type dopant. A P-type transistor includes a doped region into which the P-type dopant is doped.

The doped region may have conductivity greater than that of the non-doped region and substantially act as an electrode or a signal line. The non-doped region may substantially correspond to an active (or a channel) of the transistor. That is to say, a portion of the semiconductor pattern may be an active of the transistor, another portion may be a source or drain of the transistor, and further another portion may be a connection electrode or a connection signal line.

As illustrated in FIG. 5, a source S1, an active A1, and a drain D1 of the first transistor 111 may be formed through the semiconductor pattern, and a source S2, an active A2, and a drain D2 of the second transistor 112 may be formed through the semiconductor pattern. The sources S1 and S2 and the drains D1 and D2 extend from the actives A1 and A2 in directions opposite to each other. FIG. 5 illustrates a portion of a connection signal line SCL formed through the semiconductor pattern. Although not particularly shown, the connection signal line SCL may be connected to the drain D2 of the second transistor 112 on the plane.

The first insulation layer 10 is disposed on the buffer layer BFL. The first insulation layer 10 commonly overlaps the plurality of pixels 110 (see FIG. 4) and covers the semiconductor pattern. The first insulation layer 10 may include an inorganic layer and/or an organic layer and have a single-layered or multi-layered structure. The first insulation layer 10 may include at least one of aluminum oxide, titanium oxide, silicon oxide, silicon oxide nitride, zirconium oxide, or hafnium oxide. In this embodiment, the first insulation layer 10 may include a single-layered silicon oxide layer. The insulation layer of the circuit layer 100-2, which will be described later, as well as the first insulation layer 10 may be an inorganic layer and/or an organic layer and may have a single-layered or a multi-layered structure. The inorganic layer may include at least one of the above-described materials.

The gates G1 and G2 are disposed on the first insulation layer 10. Each of the gates G1 and G2 may be a portion of a metal pattern. The gates G1 and G2 overlap the actives A1 and A2. In the process of doping the semiconductor pattern, the gates G1 and G2 may serve as masks.

The second insulation layer 20 may be disposed on the first insulation layer 10 and may cover the gates G1 and G2. The second insulation layer 20 commonly overlaps the pixels 110 (see FIG. 4). The second insulation layer 20 may include an inorganic layer and/or an organic layer and have a single-layered or multi-layered structure. In this embodiment, the second insulation layer 20 may include a single-layered silicon oxide layer.

The upper electrode UE may be disposed on the second insulation layer 20. The upper electrode UE may overlap the gate G2 of the second transistor 112. The upper electrode UE may be a portion of the metal pattern. A portion of the gate G2 and the upper electrode UE overlapping the portion of the gate G2 may define the capacitor 113 (see FIG. 4). In an embodiment of the present disclosure, the upper electrode UE may be omitted.

The third insulation layer 30 may be disposed on the second insulation layer 20 to cover the upper electrode UE. In this embodiment, the third insulation layer 30 may be a single-layered silicon oxide layer.

A first connection electrode CNE1 may be disposed on the third insulation layer 30. The first connection electrode CNE1 may be connected to the signal line SCL through a contact hole CNT-1 passing through the first to third insulation layers 10 to 30.

A fourth insulation layer 40 may be disposed on the third insulation layer 30. The fourth insulation layer 40 may be a single-layered silicon oxide layer. A fifth insulation layer 50 may be disposed on the fourth insulation layer 40. The fifth insulation layer 50 may be an organic layer.

A first power electrode CNE2 may be disposed on the fifth insulation layer 50. The second connection electrode CNE2 may be connected to the first connection electrode CNE1 through a contact hole CNT-2 passing through the fourth insulation layer 40 and the fifth insulation layer 50.

A sixth insulation layer 60 covering the second connection electrode CNE2 is disposed on the fifth insulation layer 50. The sixth insulation layer 60 may be an inorganic layer.

The display element layer 100-3 including the light emitting element 114 may be disposed on the circuit layer 100-2. The light emitting element 114 may include a first electrode AE, a hole control layer HCL, a light emitting layer EML, an electron control layer ECL, and a second electrode CE.

The first electrode AE may be disposed on the sixth insulation layer 60. The first electrode AE may be connected to the second connection electrode CNE2 through a contact hole CNT-3 passing through the sixth insulation layer 60.

A coil 3100 may be disposed on the sixth insulation layer 60. The coil 3100 may be disposed on the same layer as the first electrode AE and may include the same material as the first electrode AE. For example, the first electrode AE and the coil 3100 may be formed at the same time through the same process. The coil 3100 and the first electrode AE may be spaced apart from each other. An AC signal may be applied to the coil 3100. Magnetic fields may be generated around the display panel 100 by the AC signal provided to the coil 3100.

A pixel defining layer 70 may be disposed on the sixth insulation layer 60 and covers a portion of the first electrode AE and the coil 3100. An opening 70-OP is defined in the pixel defining layer 70. An opening 70-OP of the pixel defining layer 70 exposes at least a portion of the first electrode AE.

As illustrated in FIG. 5, the active area 100A (see FIG. 4) may include a pixel area PXA and a non-pixel area NPXA adjacent to the pixel area PXA. The non-pixel area NPXA may surround the pixel area PXA. In this embodiment, the pixel area PXA may be defined to correspond to a portion of the first electrode AE, which is exposed by the opening 70-OP.

In the plane, the coil 3100 may not overlap the pixel area PXA. In the plane, the coil 3100 may be spaced apart from the pixel area PXA, and the coil 3100 may overlap the non-pixel area NPXA.

The hole control layer HCL may be disposed on the first electrode AE. The hole control layer HCL may be commonly disposed on the pixel area PXA and the non-pixel area NPXA. The hole control layer HCL may include a hole transport layer (not shown) and may further include a hole injection layer (not shown).

The light emitting layer EML may be disposed on the hole control layer HCL. The light emitting layer EML may be disposed on an area corresponding to the opening 70-OP. That is, the light emitting layer EML may be formed to be separated from each of the pixels PX. However, the embodiment of the present disclosure is not limited, and the light emitting layer EML may be commonly disposed on the pixel area PXA and the non-pixel area NPXA, like the hole control layer HCL.

The electron control layer ECL may be disposed on the light emitting layer EML. The electron control layer ECL may include an electron transport layer and may further include an electron injection layer. The hole control layer HCL and the electron control layer ECL may be commonly formed in the plurality of pixels by using an open mask. The second electrode CE is disposed on the electron control layer ECL. The second electrode CE is provided in one body and commonly disposed on the plurality of pixels 110 (see FIG. 4).

A capping layer 80 is disposed on the second electrode CE and contacts the second electrode CE. The capping layer 80 may include an organic material. The capping layer 80 may protect the second electrode CE from a follow-up process, for example, a sputtering process and improve emission efficiency of the light emitting element 114. The capping layer 80 may have a refractive index greater than that of the first inorganic layer 91 which will be described later.

The encapsulation layer 100-4 may be disposed on the display element layer 100-3. The encapsulation layer 100-4 may include a first inorganic layer 91, an organic layer 92, and a second inorganic layer 93. The first inorganic layer 91 and the second inorganic layer 93 may protect the display element layer 100-3 from oxygen/moisture, and the organic layer 92 may protect the display element layer 100-3 from foreign substances such as dust particles. Each of the first inorganic layer 91 and the second inorganic layer 93 may be one of a silicon oxide layer, a silicon nitride layer, a silicon oxynitride layer, and a silicon oxide layer. According to an embodiment of the present disclosure, each of the first inorganic layer 91 and the second inorganic layer 93 may include a titanium oxide layer, an aluminum oxide layer, or the like. The organic layer 92 may include an acrylic-based organic layer, but is not limited.

According to an embodiment of the present disclosure, an inorganic layer, for example, a LiF layer (not shown) may be further disposed between the capping layer 80 and the first inorganic layer 91. The LiF layer may improve light emission efficiency of the light emitting element 114.

Figure 6A:
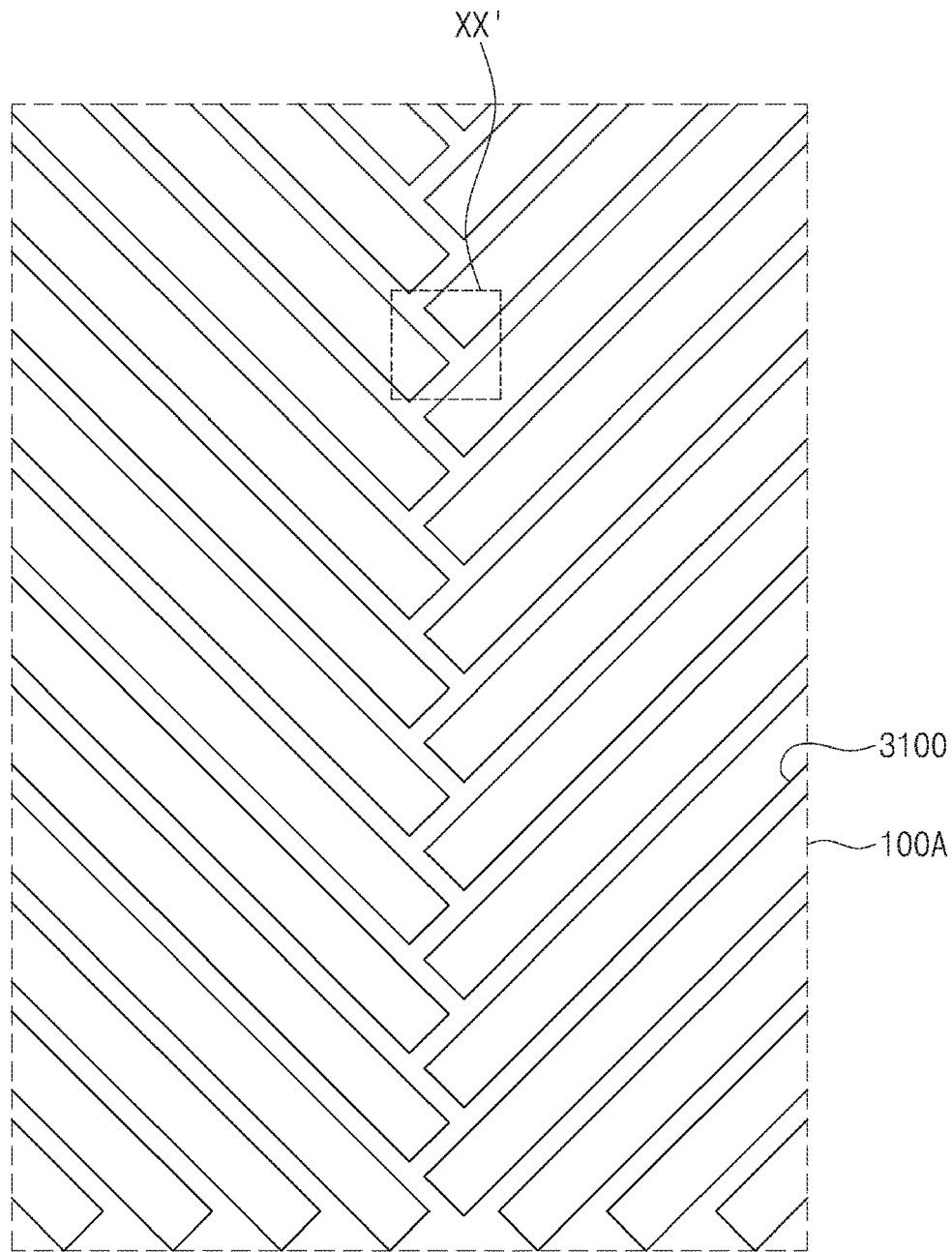
FIG. 6A is a plan view illustrating a portion of constituents of the display panel according to an embodiment of the present disclosure.
Figure 6B:
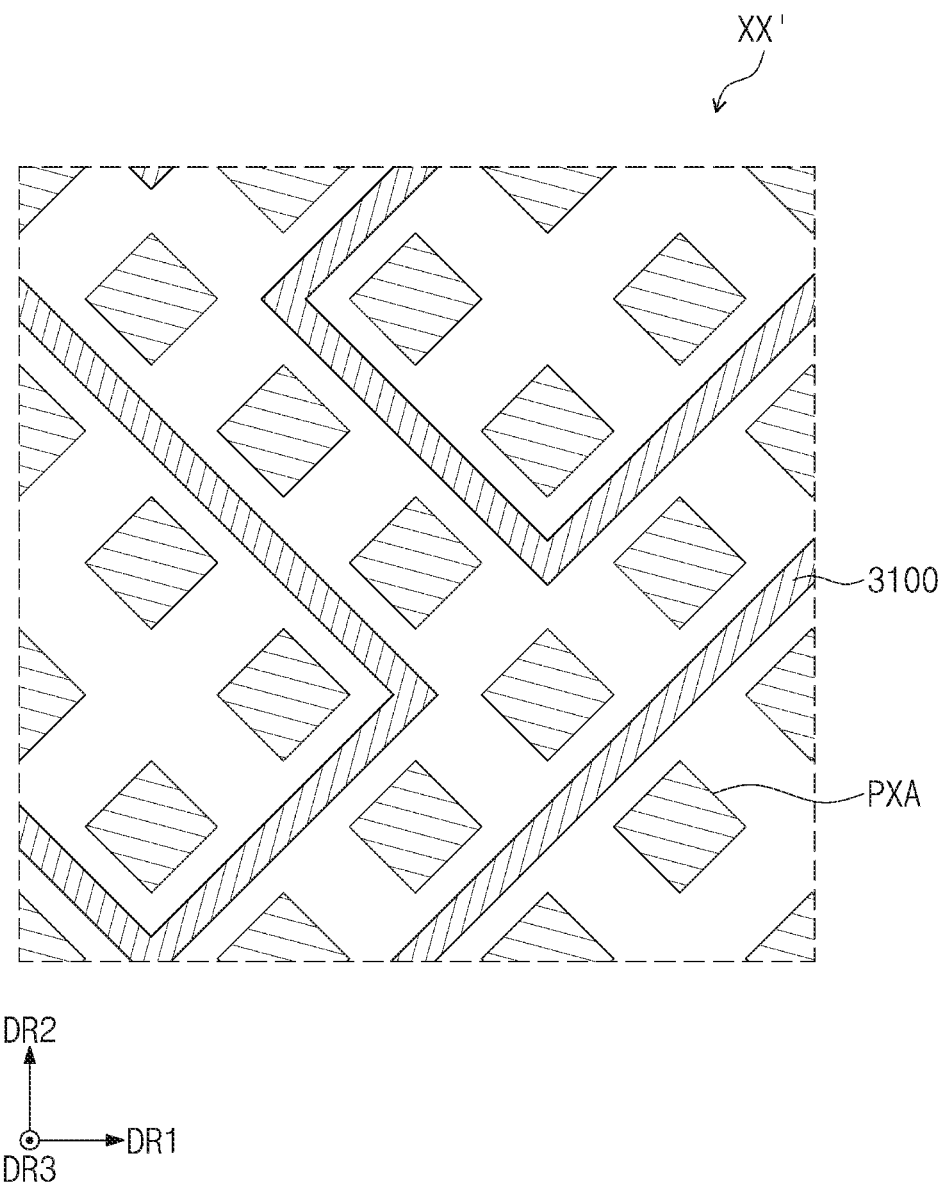
FIG. 6B is an enlarged plan view illustrating a portion of an area XX' of FIG. 6A.

FIG. 6A is a plan view illustrating a portion of constituents of the display panel according to an embodiment of the present disclosure. FIG. 6B is an enlarged plan view illustrating a portion of an area XX' of FIG. 6A.

Referring to FIGS. 6A and 6B, the coil 3100 (hereinafter, referred to as coils) may be provided in plurality. The coils 3100 may be disposed on the active area 100A. The coils 3100 may not overlap the plurality of pixel areas PXA.

Each of the coils 3100 may have a loop shape. Each of the coils 3100 may extend in a direction crossing the first direction DR1 and the second direction DR2. Some of the coils 3100 may extend in a first cross direction DRa crossing the first direction DR1 and the second direction DR2, and others of the coils 3100 may extend in a second cross direction DRb crossing the first direction DR1, the second direction DR2, and the first cross direction DRa. Some of the coils 3100 may be referred to as first coils, and others of the coils 3100 may be referred to as second coils. The coils 3100 may be arranged in a V-shaped herringbone pattern. However, the arranged shape of the coils 3100 is not limited to the example illustrated in FIG. 6A. For example, if the coils 3100 do not overlap the pixel areas PXA, the coils 3100 may be modified in various forms.

Figure 7A:
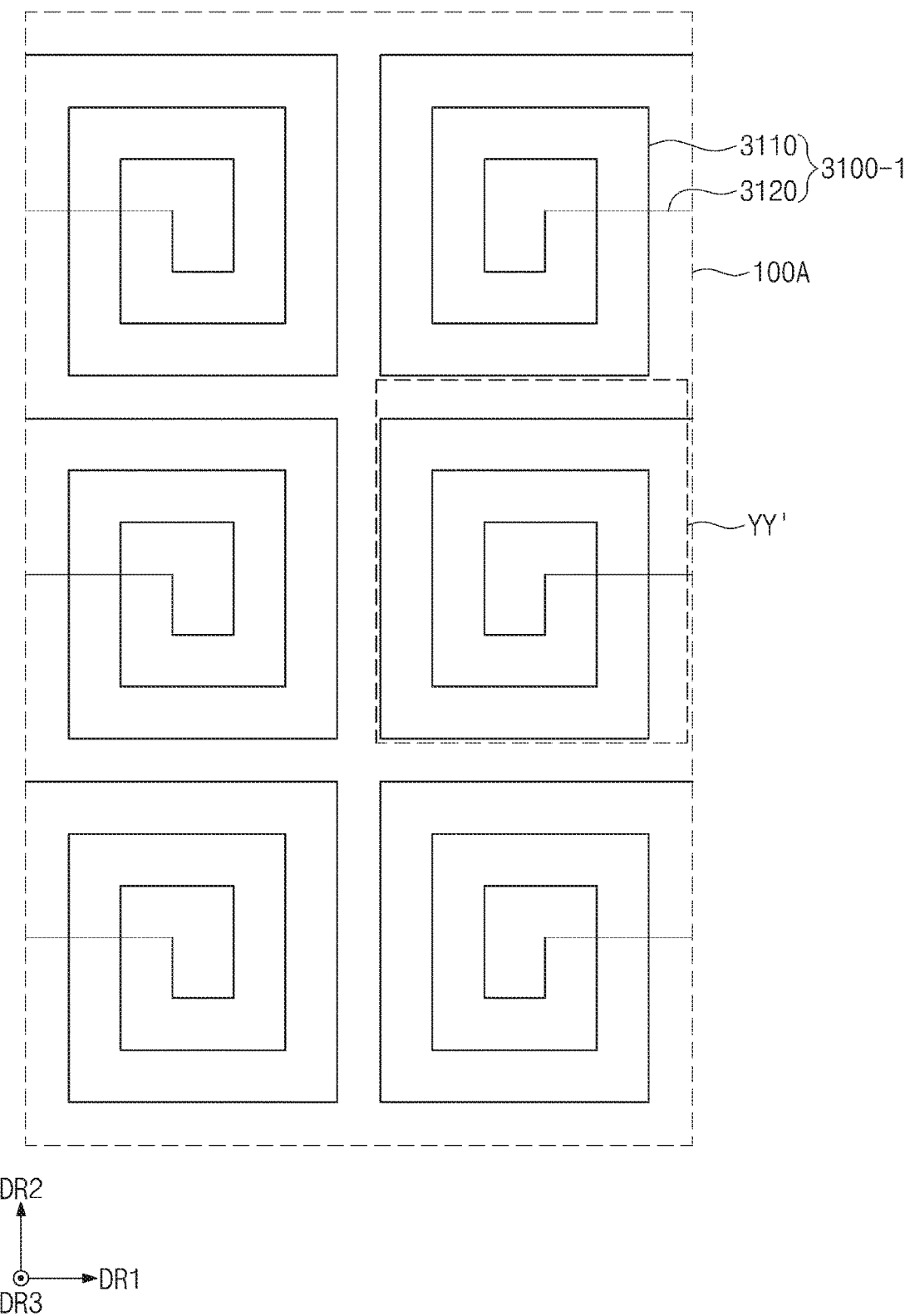
FIG. 7A is a plan view illustrating a portion of constituents of the display panel according to an embodiment of the present disclosure.
Figure 7B:
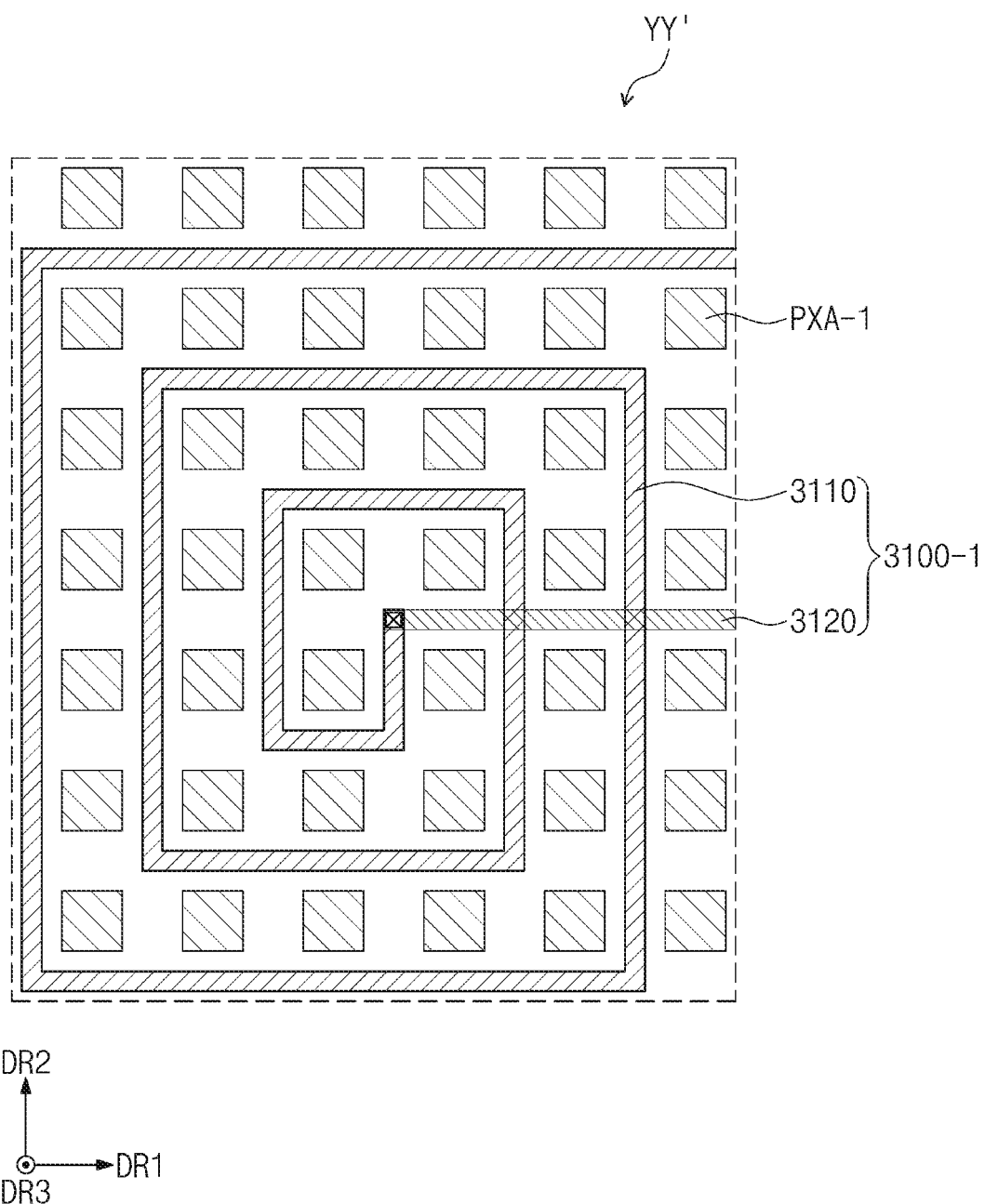
FIG. 7B is an enlarged plan view of an area YY' of FIG. 7A.

FIG. 7A is a plan view illustrating a portion of constituents of the display panel according to an embodiment of the present disclosure. FIG. 7B is an enlarged plan view of an area YY' of FIG. 7A.

Referring to FIGS. 7A and 7B, coils 3100-1 (hereinafter, referred to as coils) may be provided in plurality. The coils 3100-1 may be arranged to be spaced apart from each other in the first direction DR1 and the second direction DR2. The coils 3100-1 may be disposed on the active area 100A. The coils 3100-1 may not overlap the plurality of pixel areas PXA-1.

Each of the coils 3100-1 may include a first pattern portion 3110 and a second pattern portion 3120. The first pattern portion 3110 and the second pattern portion 3120 may be connected to each other. The first pattern portion 3110 has a spiral shape so that the first pattern portion 3110 extends in the first direction DR1 and the second direction DR2. The second pattern portion 3120 may be connected to an end of the first pattern portion 3110 and extends in the first direction DR1. In the plane, a portion of the first pattern portion 3110 and a portion of the second pattern portion 3120 may be connected to each other. The first pattern portion 3110 and the second pattern portion 3120 may be disposed on different layers.

Figure 8:
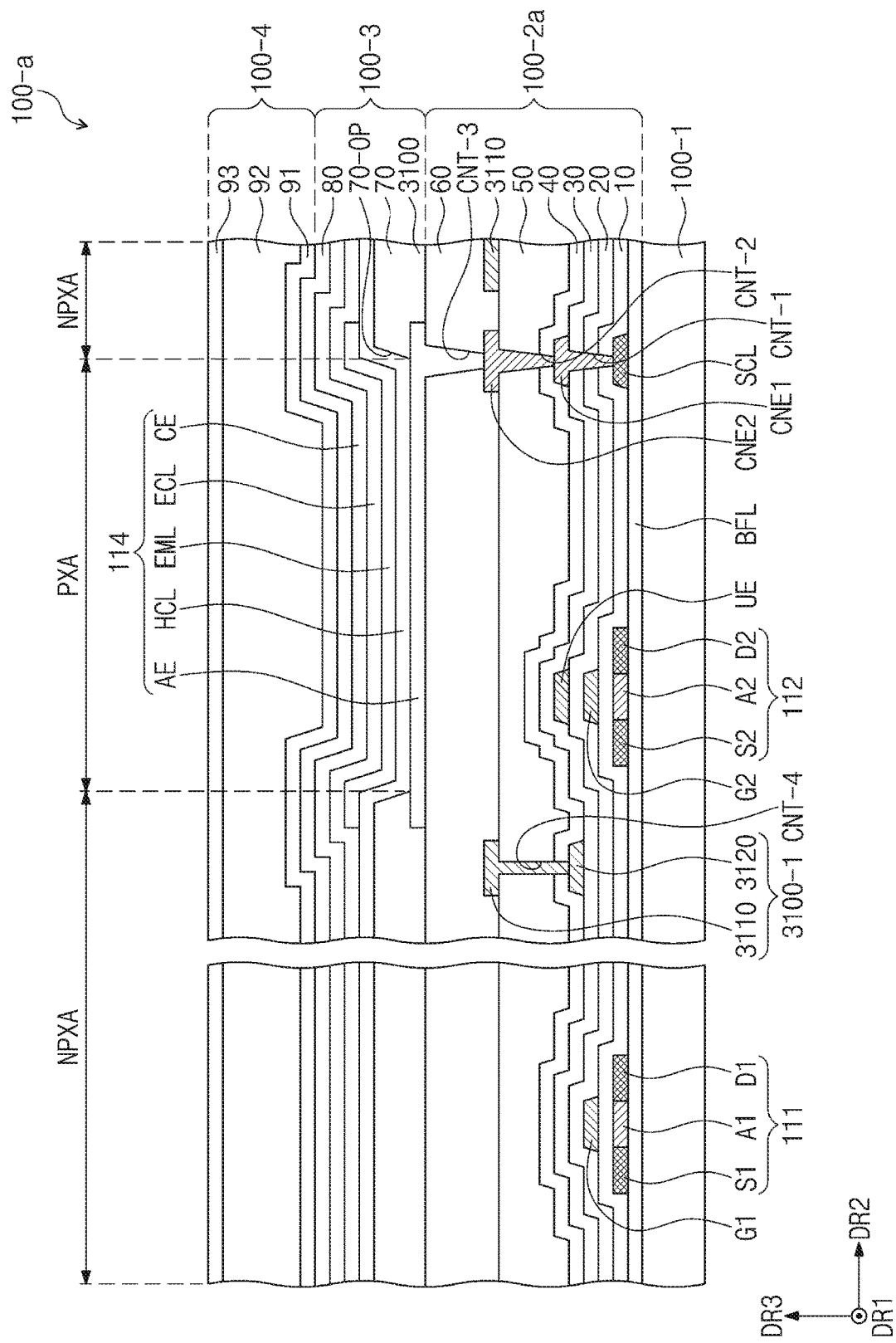
FIG. 8 is a cross-sectional view of a display panel according to another embodiment of the present disclosure.

FIG. 8 is a cross-sectional view of a display panel according to another embodiment of the present disclosure, like reference numerals are given to like elements as described above, and detailed description will be omitted.

Referring to FIG. 8, a display panel 100-a includes a base layer 100-1, a circuit layer 100-2a disposed on the base layer 100-1, a display element layer 100-3 disposed on the circuit layer 100-2a, and an encapsulation layer 100-4 covering the display element layer 100-3.

The circuit layer 100-2a includes a plurality of conductive layers, and at least a portion of the coil 3100-1 which comprises a first pattern portion 3110 and a second pattern portion 3120 may be disposed on the same layer as at least one of the plurality of conductive layers.

The first pattern portion 3110 may correspond to a portion having a spiral shape, and magnetic fields may be generated by the first pattern portion 3110. Thus, the first pattern portion 3110 may be disposed above the second pattern portion 3120.

The first pattern portion 3110 may be disposed on the fifth insulation layer 50. The first pattern portion 3110 may be disposed on the same layer as the second connection electrode CNE2 and may include the same material as the second connection electrode CNE2. The second pattern portion 3120 may be disposed on the third insulation layer 30. The second pattern portion 3120 may be disposed on the same layer as the first connection electrode CNE1 and may include the same material as the first connection electrode CNE1. The first pattern portion 3110 may be electrically connected to the second pattern portion 3120 through a contact hole CNT-4 passing through the fourth insulation layer 40 and the fifth insulation layer 50.

As illustrated in FIG. 8, the first pattern portion 3110 and the second pattern portion 3120 may be changed in position. For example, the first pattern portion 3110 may be disposed on the same layer as one of between the first insulation layer 10 and the second insulation layer 20, between the second insulation layer 20 and the third insulation layer 30, between the third insulation layer 30 and the fourth insulation layer 40, between the fifth insulation layer 50 and the sixth insulation layer 60, and on the sixth insulation layer 60, and the other one and the second pattern portion 3120 may be disposed on the same layer.

Figure 9:
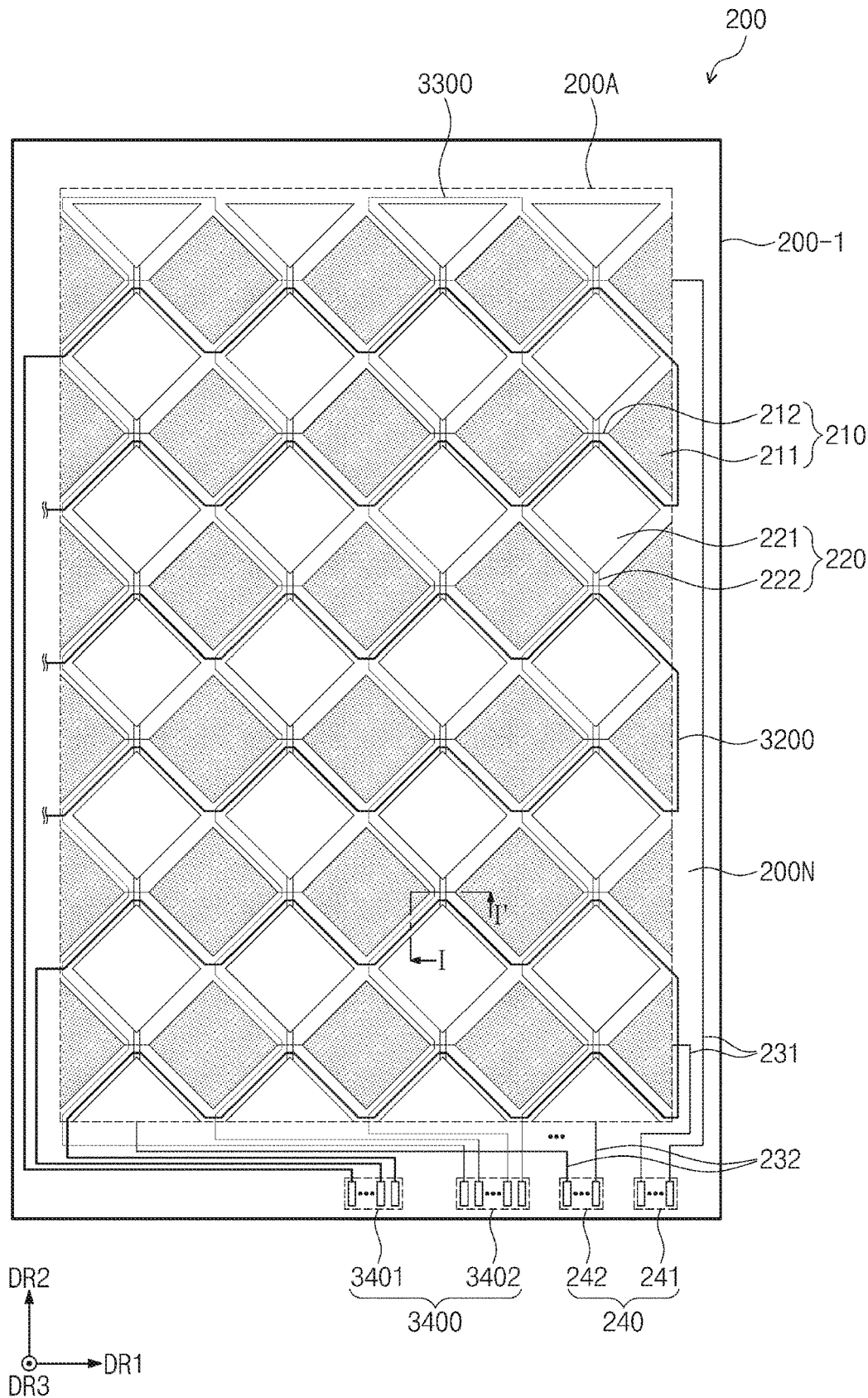
FIG. 9 is a plan view of an input sensor according to an embodiment of the present disclosure.
Figure 10:
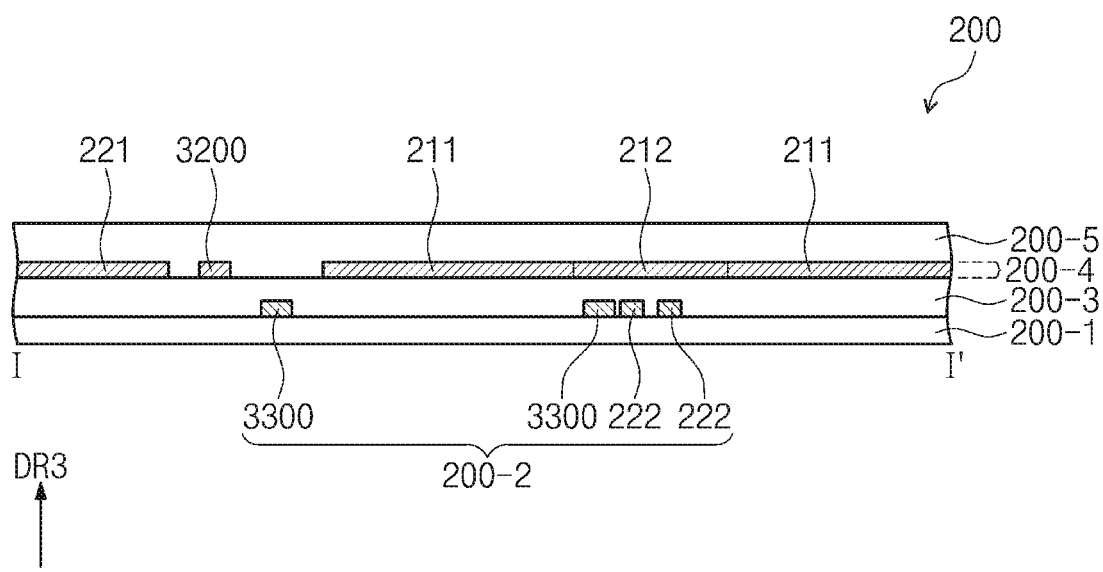
FIG. 10 is a cross-sectional view taken along line I-I' of FIG. 9 according to an embodiment of the present disclosure.

FIG. 9 is a plan view of an input sensor according to an embodiment of the present disclosure. FIG. 10 is a cross-sectional view taken along line I-I' of FIG. 9 according to an embodiment of the present disclosure.

Referring to FIG. 9, an input sensor 200 may include a sensing area 200A and a peripheral area 200N. The sensing area 200A may be an area that is activated according to an electrical signal. For example, the sensing area 200A may be an area that senses an input. The peripheral area 200N may surround the sensing area 200A.

The input sensor 200 includes a base insulation layer 200-1, first sensing electrodes 210, second sensing electrodes 220, sensing lines 231 and 232, sensing pads 240, first sensing loops 3200, second sensing loops 3300, and loop pads 3400. The first sensing electrodes 210, the second sensing electrode 220, the first sensing loops 3200, and the second sensing loops 3300 may be disposed on the sensing area 200A, and the sensing lines 231 and 232, the sensing pads 240, and the loop pads 3400 may be disposed on the peripheral area 200N.

The input sensor 200 may acquire information about an external input through a change in capacitance between the first sensing electrodes 210 and the second sensing electrodes 220.

Each of the first sensing electrodes 210 may extend in the first direction DR1, and the first sensing electrodes 210 may be arranged in the second direction DR2. The first sensing electrodes 210 may include first sensing patterns 211 and first connection patterns 212. The first connection patterns 212 may extend in the first direction DR1 and electrically connect two adjacent first sensing patterns 211 to each other. The first sensing patterns 211 and the first connection patterns 212 included in one first sensing electrode 210 may have an integral shape with each other. Accordingly, the first sensing patterns 211 may be referred to as first portions, and the first connection patterns 212 may be referred to as second portions.

Each of the second sensing electrodes 220 may extend in the second direction DR2, and the second sensing electrodes 220 may be arranged in the first direction DR1. The second sensing electrodes 220 may include second sensing patterns 221 and second connection patterns 222. The second connection patterns 222 may extend in the second direction DR2 and electrically connect two adjacent second sensing patterns 221 to each other. The two adjacent second sensing patterns 221 may be connected to each other through two second connection patterns 222, but is not limited.

The sensing lines 231 and 232 may include first sensing lines 231 and second sensing lines 232. Each of the first sensing lines 231 may be electrically connected to each of the first sensing electrodes 210 respectively. Each of the second sensing lines 232 may be electrically connected to each of the second sensing electrodes 220 respectively.

The sensing pads 240 may include first sensing pads 241 and second sensing pads 242. The first sensing pads 241 may be connected to the first sensing lines 231 respectively. The second sensing pads 242 may be connected to the second sensing lines 232 respectively.

The input sensor 200 may sense electromagnetic changes caused by approach of the electromagnetic pen 2000 (see FIG. 1) through the first sensing loops 3200 and the second sensing loops 3300. That is, the display device 1000 (see FIG. 1) may acquire input information by the electromagnetic pen 2000 (see FIG. 1) through the first sensing loops 3200 and the second sensing loops 3300.

Each of the first sensing loops 3200 may extend in the first direction DR1, and the first sensing loops 3200 may be arranged in the second direction DR2. Each of the second sensing loops 3300 may extend in the second direction DR2, and the second sensing loops 3300 may be arranged in the first direction DR1. In the plane, the first sensing loops 3200 and the second sensing loops 3300 may overlap spaces between the first sensing patterns 211 and the second sensing patterns 221.

The first sensing loops 3200 and the second sensing loops 3300 may serve as optical dummy electrodes disposed on boundary areas between the first sensing electrodes 210 and the second sensing electrodes 220. Thus, the boundary areas between the first sensing electrodes 210 and the second sensing electrodes 220 may be reduced in visibility.

The loop pads 3400 may include first loop pads 3401 and second loop pads 3402. The first loop pads 3401 may be connected to the first sensing loops 3200. The second loop pads 3402 may be connected to the second sensing loops 3300.

Referring to FIG. 10, when viewed in the cross-section, the input sensor 200 may include a base insulation layer 200-1, a first conductive layer 200-2, a sensing insulation layer 200-3, a second conductive layer 200-4, and a cover insulation layer 200-5.

The first conductive layer 200-2 may be disposed on the base insulation layer 200-1. The sensing insulation layer 200-3 may be disposed on the first conductive layer 200-2. The second conductive layer 200-4 may be disposed on the sensing insulation layer 200-3. The cover insulation layer 200-5 may be disposed on the second conductive layer 200-4.

The base insulation layer 200-1 may be an inorganic layer including one of silicon nitride, silicon oxynitride, and silicon oxide. Alternatively, the base insulation layer 200-1 may be an organic layer including an epoxy resin, an acrylic resin, or an imide-based resin. The base insulation layer 200-1 may be directly disposed on the display panel 100 (see FIG. 3). Alternatively, the base insulation layer 200-1 may be one component of the display panel 100 (see FIG. 3). Alternatively, the base insulation layer 200-1 may be disposed on a separate base layer, and the base layer may be coupled to the display panel 100 (see FIG. 3) through an adhesive member.

Each of the first conductive layer 200-2 and the second conductive layer 200-4 may have a single-layered structure or a multi-layered structure in which a plurality of layers are laminated in the third directional axis DR3. The conductive layer having the single-layer structure may include a metal layer or a transparent conductive layer. The metal layer may be formed of molybdenum, silver, titanium, copper, aluminum, and an alloy thereof. The transparent conductive layer may include transparent conductive oxide such as indium tin oxide (ITO), indium zinc oxide (IZO), zinc oxide (ZnO), and indium tin zinc oxide (ITZO). In addition, the transparent conductive layer may include a conductive polymer such as conductive polymers such as PEDOT, metal nanowires, graphene, or the like.

The conductive layer having the multilayer structure may include multilayer metal layers. The multilayer metal layers may have a three-layer structure of titanium/aluminum/titanium. The conductive layer having the multilayer structure may include at least one metal layer and at least one transparent conductive layer.

Each of the first conductive layer 200-2 and the second conductive layer 200-4 may include some of the first sensing patterns 211, the first connection patterns 212, the second sensing patterns 221, and the second connection patterns 222, the first and second sensing lines 231 and 232, the sensing pads 240, the first sensing loops 3200, the second sensing loops 3300, and the loop pads 3400.

In FIG. 10, the first conductive layer 200-2 including the second connection patterns 222 and the second sensing loops 3300, and the second conductive layer 200-4 including the first sensing patterns 211, the first connection patterns 212, the second sensing patterns 221, and the first sensing loops 3200 are illustrated as an example, but the embodiment of the present disclosure is not limited. For example, the first conductive layer 200-2 may include the first sensing patterns 211, the first connection patterns 212, the second sensing patterns 221, and the first sensing loops 3200, and the second conductive layer 200-4 may include the second connection patterns 222 and the second sensing loops 3300.

At least one of the sensing insulation layer 200-3 or the cover insulation layer 200-5 may include an inorganic layer. The inorganic layer may include at least one of oxide, titanium oxide, silicon oxide, silicon oxynitride, zirconium oxide, or hafnium oxide.

At least one of the sensing insulation layer 200-3 and the cover insulation layer 200-5 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

Figure 11:
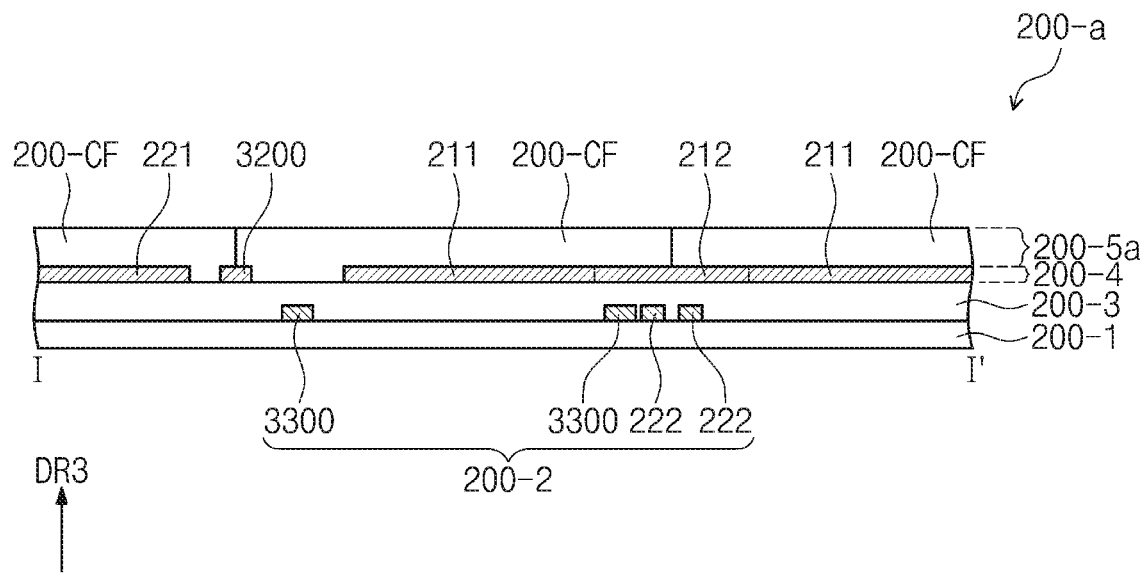
FIG. 11 is a cross-sectional view taken along line I-I' of FIG. 9 according to another embodiment of the present disclosure.

FIG. 11 is a cross-sectional view taken along line I-I' of FIG. 9 according to another embodiment of the present disclosure, like reference numerals are given to like elements as described above, and detailed description will be omitted.

Referring to FIG. 11, the input sensor 200-*a* includes a base insulation layer 200-1, a first conductive layer 200-2, a sensing insulation layer 200-3, a second conductive layer 200-4, and a color filter layer 200-5*a*.

The color filter layer 200-5*a* may be disposed on the second conductive layer 200-4 and may include a portion contacting the sensing insulation layer 200-3. The color filter layer 200-5*a* may include color filters 200-CF.

The color filters 200-CF not only transmit light generated from the light emitting element 114 (see FIG. 5), but also reduce reflectance of light incident from outside (hereinafter, referred to as external light). As the external light passes through the color filters 200-CF, an amount of light may be reduced to about ⅓ of the original light. A portion of the light passing through the color filters 200-CF is extinguished, and a portion of the light may be reflected from the components disposed under the color filters 200-CF, for example, the display element layer 100-3 (see FIG. 5) and the encapsulation layer 100-4 (see FIG. 5). The reflected light is incident again into the color filters 200-CF. The reflected light is reduced in brightness while passing through the color filters 200-CF. As a result, only a portion of the external light may be reflected from the display device. That is, the external light is reduced in reflectance.

Figure 12:
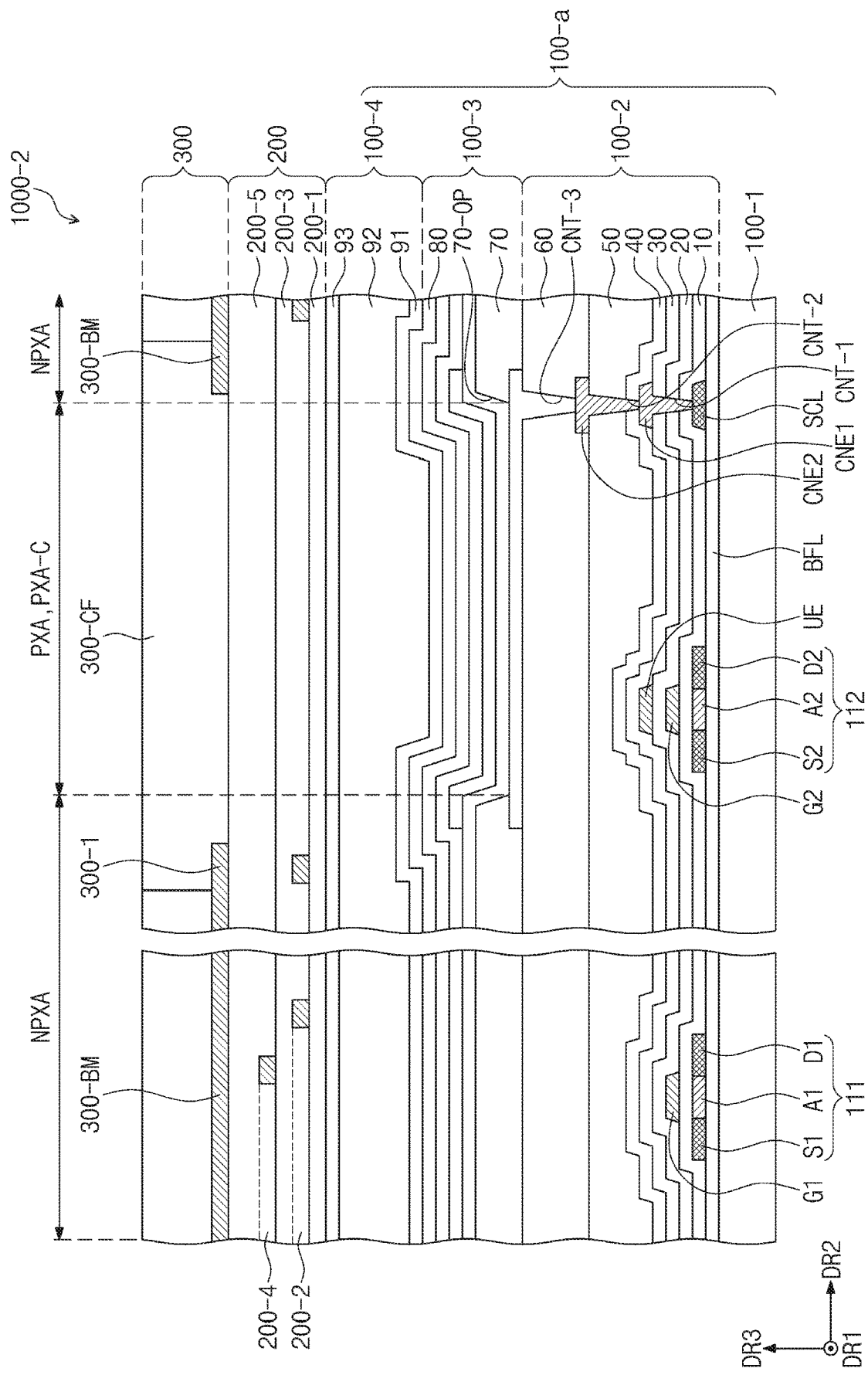
FIG. 12 is a cross-sectional view of a display device according to another embodiment of the present disclosure.
Figure 13:
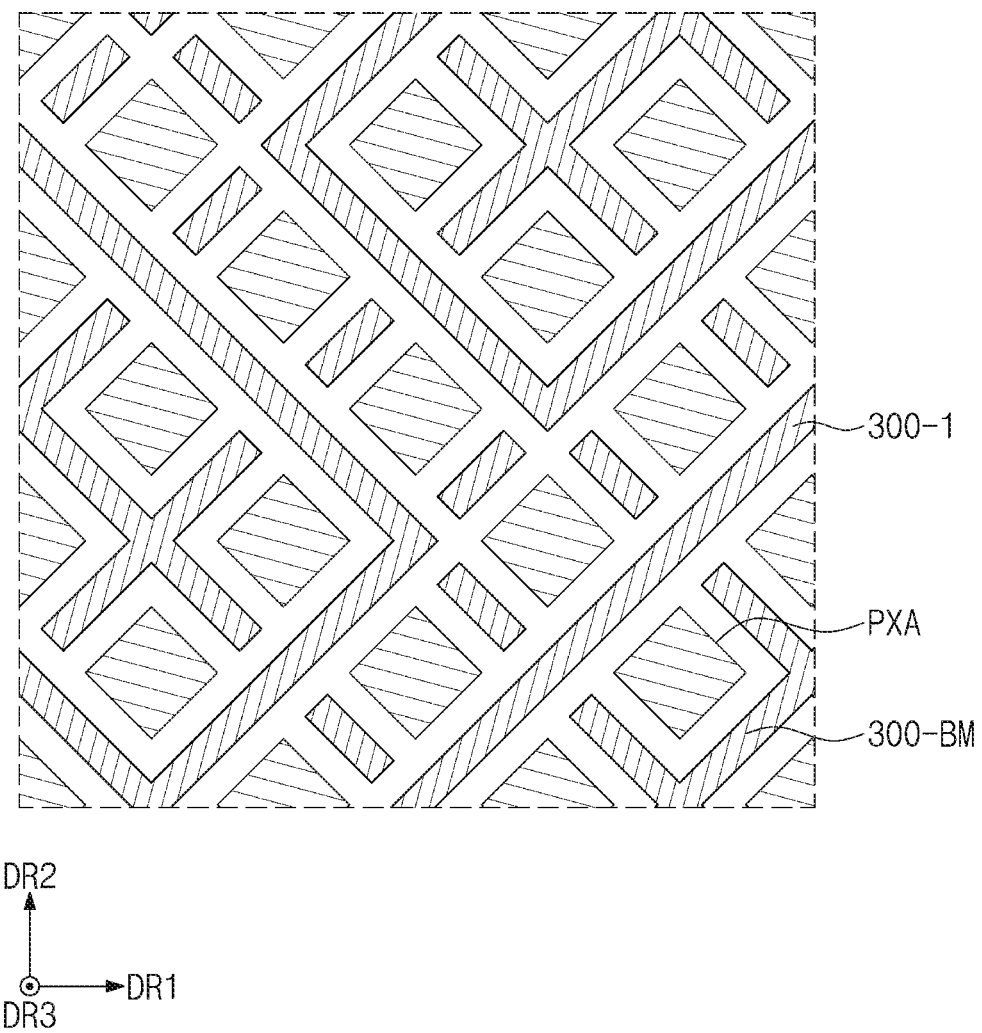
FIG. 13 is a plan view illustrating a portion of constituents of the display device of FIG. 12.

FIG. 12 is a cross-sectional view of a display device according to another embodiment of the present disclosure, like reference numerals are given to like elements as described above, and detailed description will be omitted. FIG. 13 is a plan view illustrating a portion of constituents of the display device of FIG. 12.

Referring to FIG. 12, a display device 1000-2 may include a display panel 100-a, an input sensor 200, and a functional layer 300. The input sensor 200 may be disposed on the display panel 100-a, and the functional layer 300 may be disposed on the input sensor 200.

The display panel 100-a may not include the coil 3100 when compared to the display panel 100 described above with reference to FIG. 5. The input sensor 200 may have substantially the same structure as the input sensor 200 described with reference to FIGS. 9 and 10.

The functional layer 300 may include a coil 300-1, a plurality of color filters 300-CF, and a light blocking pattern 300-BM. The coil 300-1 and the light blocking pattern 300-BM may be disposed on the input sensor 200. The coil 300-1 and the light blocking pattern 300-BM include substantially the same material and may be formed through the same process. The coil 300-1 may function as the light blocking pattern 300-BM, and the light blocking pattern 300-BM may be additionally disposed on an area on which the coil 300-1 is not disposed. However, the embodiment of the inventive concept is not limited thereto. For example, the light blocking pattern 300-BM may be omitted.

A pixel area PXA-C may be defined on the functional layer 300. The pixel area PXA-C of the functional layer 300 may correspond to the pixel area PXA of the display panel 100-a as shown in FIG. 8. The color filters 300-CF may be disposed on the pixel area PXA-C, and the coil 300-1 and the light blocking pattern 300-BM may not be disposed on the pixel area PXA-C. That is, the coil 300-1 and the light blocking pattern 300-BM may overlap a non-pixel area NPXA.

According to an embodiment of the present disclosure, the coil 300-1, the first sensing loops 3200 (see FIG. 9), and the second sensing loops 3300 (see FIG. 9) may be built in the display device 1000 (see FIG. 1). For example, the coil 300-1 may be provided in the display panel 100 (see FIG. 5) or may be provided in the functional layer 300. The first sensing loops 3200 (see FIG. 9) and the second sensing loops 3300 (see FIG. 9) may be provided in the input sensor 200.

That is, according to an embodiment of the present disclosure, a separate digitizer for sensing the input by the electromagnetic pen 2000 (see FIG. 1) may not be additionally attached. Thus, since the display device 1000 (see FIG. 1) is reduced in thickness, the thin display device 1000 (see FIG. 1) may be provided. In addition, the flexibility of the display device 1000 may be improved by reducing the thickness of the display device 1000 (see FIG. 1). As a result, the foldable display device 1000-1 (see FIG. 2) capable of sensing the input by the electromagnetic pen (see FIG. 2) may be provided.

According to the embodiment of the present disclosure, the display device may include the coil, the first sensing loop, and the second sensing loop to sense the touch through the electromagnetic pen. Each of the coil, the first sensing loop, and the second sensing loop may be disposed on the same layer as a portion of the layers constituting the display device. That is, the coil, the first sensing loop, and the second sensing loop may be built in the display device. Thus, the display device that senses the touch through the electromagnetic pen may be reduced in thickness. In addition, as the display device is reduced in thickness, the display device may be improved in flexibility.

It will be apparent to those skilled in the art that various modifications and variations can be made in the inventive concept. Thus, it is intended that the present disclosure covers the modifications and variations of this disclosure provided they come within the scope of the appended claims and their equivalents. Hence, the real protective scope of the present disclosure shall be determined by the technical scope of the accompanying claims.

What is claimed is:

1. A display device comprising:
    a functional layer in which a plurality of pixel areas are defined and which includes a coil to which an AC signal is applied; and
    an input sensor configured to sense an input from an external source and disposed on the functional layer,
    wherein the input sensor comprises:
    a first conductive layer including a first sensing loop extending in a first direction;
    a sensing insulation layer disposed on the first conductive layer; and
    a second conductive layer disposed on the sensing insulation layer and including a second sensing loop extending in a second direction crossing the first direction, and
    wherein the coil comprises a first pattern portion having a spiral shape and a second pattern portion connected to an end of the first pattern portion.

2. The display device of claim 1, wherein the functional layer further comprises:
    a base layer;
    a circuit layer disposed on the base layer and including a transistor; and
    a display element layer disposed on the circuit layer and including a light emitting element,
    wherein the functional layer provides an image toward the input sensor.

3. The display device of claim 2, wherein the circuit layer comprises a plurality of conductive layers, and
    at least a portion of the coil is disposed on a same layer as at least one conductive layer of a plurality of conductive layers.

4. The display device of claim 2, wherein the light emitting element comprises:
    a first electrode electrically connected to the transistor;
    a light emitting layer disposed on the first electrode; and
    a second electrode disposed on the light emitting layer,
    wherein the coil is disposed on a same layer as the first electrode and spaced apart from the first electrode.

5. The display device of claim 2, wherein the input sensor further comprises a cover insulation layer disposed on the second conductive layer.

6. The display device of claim 2, wherein the input sensor further comprises a color filter layer disposed on the second conductive layer to contact the sensing insulation layer.

7. The display device of claim 1, wherein the first pattern portion and the second pattern portion are disposed on layers different from each other.

8. The display device of claim 1, wherein the coil is provided in plurality, and a plurality of coils are arranged to be spaced apart from each other in the first direction and the second direction.

9. The display device of claim 1, wherein one of the first conductive layer and the second conductive layer further comprises first sensing patterns, second sensing patterns, and a first connection pattern configured to connect the first sensing patterns to each other, and
    an other of the first conductive layer and the second conductive layer further comprises a second connection pattern configured to connect the second sensing patterns to each other.

10. The display device of claim 9, wherein, when viewed from a top plan, the first sensing loop and the second sensing loop surround some of the first sensing patterns and some of the second sensing patterns respectively.

11. The display device of claim 9, wherein, in a plane, each of the first sensing loop and the second sensing loop has a shape corresponding to a boundary between each of the first sensing patterns and each of the second sensing patterns.

12. A display device comprising:
a functional layer in which a plurality of pixel areas are defined and which includes a coil to which an AC signal is applied and a plurality of color filters; and
an input sensor configured to sense an input from an external source and disposed on the functional layer,
wherein the input sensor comprises:
a first conductive layer including a first sensing loop extending in a first direction;
a sensing insulation layer disposed on the first conductive layer; and
a second conductive layer disposed on the sensing insulation layer and including a second sensing loop extending in a second direction crossing the first direction,
wherein each of the plurality of color filters are disposed in a one-to-one correspondence to each of the plurality of pixel areas, and
wherein the coil functions as a light blocking pattern.

13. The display device of claim 12, further comprising a display panel including a display element layer disposed on the input sensor and including a light emitting element, wherein the display panel is configured to provide an image toward the functional layer.

14. The display device of claim 1, wherein the functional layer and the input sensor are folded.

15. A display device comprising:
a display panel comprising a base layer, a circuit layer disposed on the base layer, and a light emitting element disposed on the circuit layer;
an input sensor disposed on the display panel and including a first sensing electrode, a second sensing electrode, a first sensing loop, and a second sensing loop; and
at least one coil to which an AC signal is applied,
wherein the coil is disposed between the base layer and the input sensor configured to be provided in the display panel or disposed on the input sensor,
wherein a plurality of pixel areas and a non-pixel area adjacent to the plurality of pixel areas are defined in the display panel, and
the coil, the first sensing loop, and the second sensing loop overlap the non-pixel area.

16. The display device of claim of claim 15, wherein the coil is disposed on a same layer as a conductive layer constituting the circuit layer or disposed on a same layer as a conductive layer constituting the light emitting element.

17. The display device of claim of claim 16, further comprises a color filter layer disposed on the input sensor, wherein the coil is disposed between the input sensor and the color filter layer and is covered by the color filter layer.

* * * * *